(12) United States Patent
Matsuura

(10) Patent No.: US 7,601,585 B2
(45) Date of Patent: Oct. 13, 2009

(54) METHOD OF MANUFACTURING A FERROELECTRIC SEMICONDUCTOR DEVICE UTILIZING AN OXIDE REDUCTION FILM

(75) Inventor: Katsuyoshi Matsuura, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 206 days.

(21) Appl. No.: 11/588,320

(22) Filed: Oct. 27, 2006

(65) Prior Publication Data

US 2008/0003738 A1 Jan. 3, 2008

(30) Foreign Application Priority Data

Jun. 30, 2006 (JP) .............................. 2006-182154

(51) Int. Cl.
*H01L 21/00* (2006.01)
(52) U.S. Cl. ...................................... 438/239; 257/306
(58) Field of Classification Search .................... 438/3, 438/244, 387, 396, 239, 253, 254; 257/303, 257/306
See application file for complete search history.

(56) References Cited

U.S. PATENT DOCUMENTS 5,504,041 A 4/1996 Summerfelt

| 5,679,980 | A | 10/1997 | Summerfelt |
| 5,851,896 | A | 12/1998 | Summerfelt |
| 6,358,855 | B1 * | 3/2002 | Ramachandran et al. ..... 438/692 |
| 6,479,304 | B1 * | 11/2002 | Zhang et al. .................... 438/3 |
| 7,371,589 | B2 * | 5/2008 | Kweon .......................... 438/3 |
| 2004/0113189 | A1 * | 6/2004 | Takamatsu et al. .......... 257/295 |

FOREIGN PATENT DOCUMENTS

JP 8-64786 3/1996

OTHER PUBLICATIONS

D. Lide, CRC Handbook of Chemistry and Physics, 2007, CRC Press/Taylor & Francis, 88th Edition, pp. 10.202-10.204.*

* cited by examiner

*Primary Examiner*—David Vu
*Assistant Examiner*—Suberr Chi
(74) *Attorney, Agent, or Firm*—Westerman, Hattori, Daniels & Adrian, LLP

(57) ABSTRACT

In pattern-forming ferroelectric capacitor structures by a one mask etching, after an Ir film to be a lower electrode film is formed, an $AlO_x$ film to be an oxide reduction film reducing an Ir oxide which is formed on a surface layer of the lower electric film is deposited on the lower electrode film, and then this oxide reduction film is removed by, for example, a dilute hydrofluoric acid treatment.

19 Claims, 12 Drawing Sheets

CROSS SECTION A

METHOD OF MANUFACTURING A FERROELECTRIC SEMICONDUCTOR DEVICE UTILIZING AN OXIDE REDUCTION FILM

CROSS-REFERENCE TO RELATED APPLICATIONS

This application is based upon and claims the benefit of priority from the prior Japanese Patent Application No. 2006-182154, filed on Jun. 30, 2006, the entire contents of which are incorporated herein by reference.

BACKGROUND OF THE INVENTION

1. Field of the Invention

The present invention relates to a manufacturing method of a semiconductor device having a capacitor structure in which a capacitor film made of a ferroelectric material is sandwiched between a lower electrode and an upper electrode.

2. Description of the Related Art

As a nonvolatile memory capable of storing information even when a power supply is stopped, a flash memory and an FRAM (Ferro-electric Random Access Memory, a registered trade mark of Ramtron International Corporation, U.S.A.) are known.

The flash memory has a floating gate embedded in a gate insulating film of an IGFET (Insulated Gate Field Effect Transistor), and stores information by accumulating electric charges indicating storage information in the floating gate. In order to write/delete information, it is necessary to flow a tunnel current passing through the insulating film, and so a relatively high voltage is required.

On the other hand, the FRAM stores information using a hysteresis characteristic of a ferroelectric. A ferroelectric capacitor structure, which has a ferroelectric film as a capacitor dielectric between a pair of electrodes, generates a polarization in response to an applied voltage between the electrodes, and has a spontaneous polarization even when the applied voltage is removed. When a polarity of the applied voltage is reversed, a polarity of the spontaneous polarization is also reversed. Detection of this spontaneous polarization enables reading of information. The FRAM operates at a lower voltage compared with the flash memory, and high-speed writing is possible with saved power.

FIG. 12A is a circuit diagram of a 2T/2C type memory cell of the FRAM. In FIG. 12A, there is shown the 2T/2C type memory cell in which two transistors Ta, Tb and two capacitors Ca, Cb are used for storing one bit information. In such a 2T/2C type memory cell, a complementary operation is carried out in which information of "1" or "0" is stored in one capacitor Ca, while reverse information is stored in the other capacitor Cb. Meanwhile, though the 2T/2C type memory cell has a configuration resistant to variation of processes, the 2T/2C type memory cell has a cell area of approximately twice a memory cell area of a 1T/1C type memory cell described below.

FIG. 12B is a circuit diagram of the 1T/1C type memory cell of the FRAM. In FIG. 2B, there is shown the 1T/1C type memory cell in which one transistor T1 and one capacitor C1 can be used or the other transistor T2 and the other capacitor C2 can be used for storing one bit information, and a configuration thereof is similar to that of a DRAM. Such a 1T/1C type memory cell has a small cell area and is capable of high integration. However, a reference voltage is required in order to judge whether an electric charge read from the memory cell is information of "0" or information of "1". A reference cell generating this reference voltage reverses the polarization every time the electric charge is read. Therefore, the reference cell deteriorates faster than the memory cell due to fatigue. Additionally, the 1T/1C type has a narrower margin of judgment than the 2T/2C type, and is vulnerable to variation of processes.

As capacitor films of the capacitors in FIG. 12A and FIG. 12B, there are used a material of PZT series such as PZT (Pb(Zr, Ti)O$_3$), La-doped PZT (PLZT) or the like, or a Bi-layered structure compound such as SBT (SrBi$_2$Ta$_2$O$_9$), SBTN (SrBi$_2$(Ta, NB)$_2$O$_9$) or the like, being a ferroelectric film. These ferroelectric films are easy to be reduced by hydrogen, and in order to maintain quality as a FRAM, it is necessary to carry out a recovery annealing in an oxidizing atmosphere of 500° C. to 700° C. after the ferroelectric film is formed. It is because a process after formation of a ferroelectric capacitor structure such as growth of an interlayer insulating film includes a step in which hydrogen is generated.

There is a tendency that the 1T/1C type circuit enabling high integration is used and a stacked type FRAM (structure in which the ferroelectric capacitor structure and a selection transistor structure are directly connected with a conductive plug) is adopted in order to further improve integration degree, as a FRAM of the next generation, for example a FRAM of 0.18 μm generation.

As a material for the conductive plug connected to the ferroelectric capacitor structure in the stacked type FRAM, tungsten (W) is generally used. It is because tungsten (W) has a lower resistance a heat resistance, compared with polycrystalline silicon to which an impurity is added. However, since tungsten (W) becomes an oxide with an extremely high resistance when oxidized, the resistance becomes high even when a part thereof is oxidized and it becomes hard to secure contact.

On the other hand, for a lower electrode of the ferroelectric capacitor structure, a noble metal such as platinum (Pt) or iridium (Ir) is used in order to evade oxidation deterioration due to the above-described recovery annealing in the oxidizing atmosphere. Additionally, there is also used a conductive noble metal oxide which can maintain conductivity even when oxidized, for example, IrO$_2$, SrRuO$_3$, La$_{0.5}$Sr$_{0.5}$CoO$_3$ or the like.

However, the lower electrode made of the material as above cannot restrain diffusion of oxygen at a temperature of about 600° C. Therefore, if the recovery annealing is carried out at the high temperature as above, a W plug in the stacked type FRAM is oxidized through the lower electrode.

In order to prevent such oxidation, it is suggested that an oxygen barrier layer is provided between the lower electrode and the conductive plug (see Patent Document 1, for example). In this suggestion, it is reported that a titanium aluminum nitride (TiAlN) film to be the oxygen barrier layer is inserted between a titanium nitride (TiN) film being a part of the conductive plug and the lower electrode. If such an oxygen barrier layer is provided, oxidation of the conductive plug can be prevented. It is because an oxidation speed of TiAlN is slower than that of TiN by more than two digits. Though aluminum nitride (AlN) itself exhibits insulation performance, aluminum nitride (AlN) exhibits conductivity when a cation impurity such as titanium (Ti) is added or an AlN film which is deficient in nitride (N) is formed, and therefore contact failure by providing this oxygen barrier does not become a problem.

As methods for forming the ferroelectric film to be the capacitor film, in addition to a sputtering method, there are presently known a sol-gel method and an MOCVD (Metal Organic Chemical Vapor Deposition) method. When the ferroelectric film, for example a PZT film, is formed by the sputtering method, platinum (Pt) is used as the material for the lower electrode to be a base thereof. It is because the lower electrode to be the base of the PZT film is required to be intensely oriented to the (111) face in order to increase the spontaneous polarization of a crystal of the PZT film, and platinum (Pt) is suitable as the base of the PZT film since platinum is intensely oriented to the (111) face.

However, the PZT film made by the sputtering method is poor in crystallinity if it is formed at a high temperature. Therefore, it is necessary that, after an amorphous film is formed at a low temperature, a rapid thermal annealing (RTA) is carried out in an oxygen atmosphere for crystallization. Since crystallization by the RTA processing requires a high temperature of 700° C. or more, it is afraid that the W plug is oxidized in the stacked type FRAM even if the oxygen barrier layer such as TiAlN is used.

In contrast, when the PZT film is formed by the MOCVD method, the PZT film is grown with good crystallinity being maintained on the lower electrode in a growth process. Therefore, a crystallization annealing is unnecessary and the lowering of the temperature in the process can be expected.

However, when the PZT film is formed by the MOCVD method, platinum (Pt) is unsuitable as a composing material of the lower electrode. It is because lead (Pb) in the PZT film reacts with platinum (Pt) and forms $PtPb_x$, and roughness is generated on an interface between the lower electrode and the PZT film, deteriorating film quality. Therefore, when the PZT film is formed by the MOCVD method, a material other than platinum (Pt) must be selected as the lower electrode.

Thus, when forming the ferroelectric film by the MOCVD method, it is necessary to adopt a noble metal other than platinum (Pt) or a conductive noble metal oxide as the lower electrode. Among such materials, if an oxide conductive material such as iridium oxide (IrOx) is used as the lower electrode, the oxide conductive material is reduced at the time of formation of the PZT film by the MOCVD method, and so it is difficult to adopt the oxide conductive material. Therefore, the noble metal such as iridium (Ir) is adopted as the material for the lower electrode.

If the TiAlN film as the oxygen barrier layer is also used when the noble metal such as iridium (Ir) is used as the material of the lower electrode as above, contact capability of the W plug can be maintained even if the recovery annealing is carried out at 700° C. Therefore, insertion of the TiAlN film is advantageous in terms of oxidation resistance of the W plug.

[Patent Document 1] Japanese Patent Application Laid-open No. Hei 8-64786

As described above, in adopting the stacked type structure to enhance further miniaturization and high integration in the FRAM, various contrivances are made about oxidation prevention of the W plug connected to the lower electrode in the ferroelectric capacitor structure, selection of the ferroelectric material for obtaining a superior orientation property of the ferroelectric film to be the capacitor film, and preferable selection of the lower electrode material considering the ferroelectric material which is superior in oxidation prevention of the W plug and the orientation property, and careful consideration is given in order to solve inconveniences occurring when the respective configurations are adopted.

Further, in the stacked type FRAM, in order to realize high integration thereof substantially, it is fundamental that a multi-layered body of the respective films (lower electrode film, capacitor film and upper electrode film) constituting the ferroelectric capacitor structure is collectively etched (one mask etching process) at the time of formation of the ferroelectric capacitor structure.

SUMMARY OF THE INVENTION

As for the stacked type FRAM described above, the present inventor is skeptical about simply adopting the one mask etching process at the time of formation of the ferroelectric capacitor structure, and carries out the following examination. Here examined after the above multi-layered body is collectively etched is a surface state of a film which is entirely formed in a layer under a formed ferroelectric capacitor structure, here, an interlayer insulating film in which a W plug connected to a lower electrode is formed in an embedded manner.

More specifically, on a semiconductor substrate, a TiAlN film being an oxygen barrier film and an Ir film as a lower electrode film are stacked by a sputtering method on the interlayer insulating film in which the W plug is formed, and then a PZT film being a ferroelectric material is formed as a capacitor film by an MOCVD method. Additionally, as an upper electrode film, $IrO_2$\Ir from the bottom are formed by the sputtering method. Subsequently, as a hard mask material, TiN\P-TEOS films from the bottom are formed on the upper electrode film, and these are patterned in an electrode shape to form the hard mask. Then, with the hard mask being used, the multi-layered body made of the lower electrode film, the capacitor film and the upper electrode film is collectively etched.

The surface state after the one mask etching is observed with a scanning electron microscope (SEM), and as shown in FIG. 13, it is revealed that numerous holes are formed in a part in which a pattern by the etching processing does not exist.

In the example of FIG. 13, a state is shown in which the upper electrode film to the lower electrode film are patterned by the one mask etching. Though the film in which generation of the holes is directly confirmed is the oxygen barrier film made of TiAlN, the oxygen barrier film existing directly under the lower electrode film, it is also confirmed that holes are similarly formed in the interlayer insulating film thereunder. Since these holes are comparatively large, formation of the holes damages a function as the interlayer insulating film. Therefore, it is not possible to proceed to the succeeding manufacturing process in this state.

The present invention is made in view of the above problem, and its object is to maintain a surface state of a film which is entirely formed in a layer under a pattern-formed ferroelectric capacitor structure, here, an interlayer insulating film, in a good condition in spite of a one mask etching at the time of formation of the ferroelectric capacitor structure for realizing high integration of a semiconductor device, and to provide a manufacturing method of a highly reliable semiconductor device.

A manufacturing method of a semiconductor device of the present invention is a manufacturing method of a semiconductor device having a capacitor structure in which a capacitor film made of a ferroelectric material is sandwiched by a lower electrode and an upper electrode above a semiconductor substrate, the manufacturing method including the steps of: after forming a lower electrode film to be the lower electrode, depositing on the lower electrode film an oxide reduction film reducing an oxide formed on a surface layer of the lower electrode film; and removing the oxide reduction film on the lower electrode film.

DETAILED DESCRIPTION OF THE PREFERRED EMBODIMENTS

Basic Gist of the Present Invention

In order to find a cause of numerous holes generated in an interlayer insulating film which is entirely formed in a layer under a ferroelectric capacitor structure, the present inventor carries out the following experiments.

First, a surface state of an upper electrode before a one mask etching is carried out is examined with a SEM.

Figure 1:
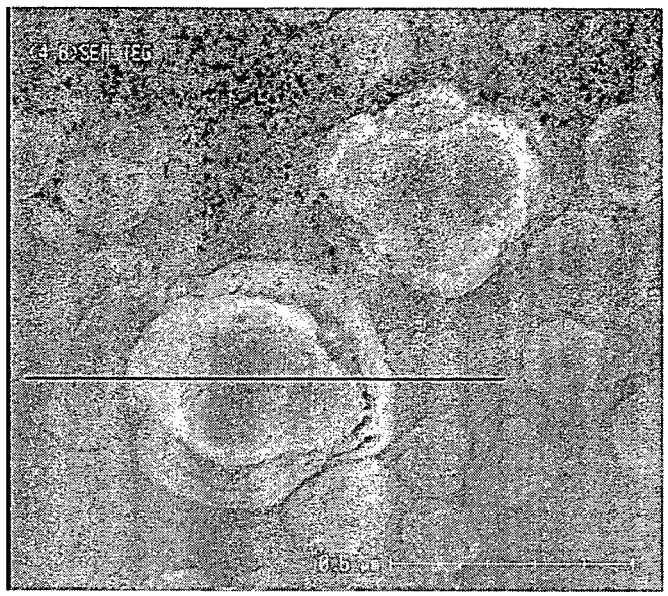
FIG. 1 is a view showing a photograph, by an electron microscope, of a surface state of an Ir film before a one mask etching is carried out.

As the surface state, as shown in FIG. 1, it is revealed that a large-sized foreign object is generated on a surface of an Ir film to be a top layer of the upper electrode.

Next, a cross section (shown as a cross section A in FIG. 1) in a part of the foreign object in FIG. 1 is observed by the SEM.

Figure 2:
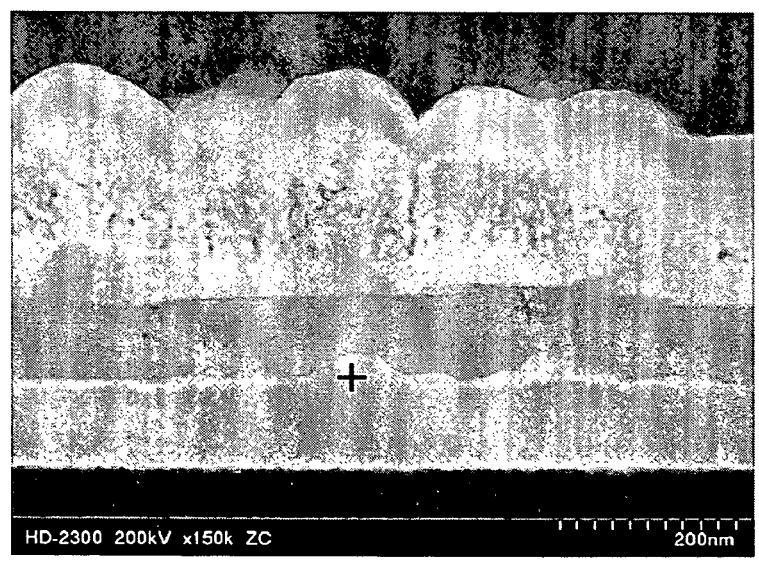
FIG. 2 is a view showing a photograph, by the electron microscope, of a cross section in a part of a foreign object of FIG. 1.

A result thereof is shown in FIG. 2. As in FIG. 2, an upper electrode $IrO_2$ in the part of the foreign object of the Ir film surface is in a porous state in terms of a film quality. It is considered that the etching of the part of the foreign object of the Ir film surface progresses faster compared with other parts, so that a hole is generated in the part corresponding to a formation position of the above-described foreign object in the interlayer insulating film under the Ir film.

Further, on the surface of the Ir film being a lower electrode film a projecting portion (hereinafter referred to as an Ir hillock) is generated. When seen with this Ir hillock being a base point (for example, a part indicated by "+" in the view), it is revealed that a PZT film being a capacitor film formed by an MOCVD method is abnormally grown at a position aligned with the above-described base point. Further, at a position aligned with the part of the abnormal growth of the PZT film, the foreign object of FIG. 1 is generated on the Ir film surface to be the top layer. Therefore, it is inferred that the Ir hillock is the cause to generate the foreign object in FIG. 1.

Thus, in order to find the cause to generate the Ir hillock, the present inventor observes a surface state of the Ir film being the lower electrode film using an XPS (X-ray Photoemission Spectroscopy).

Figure 3A:
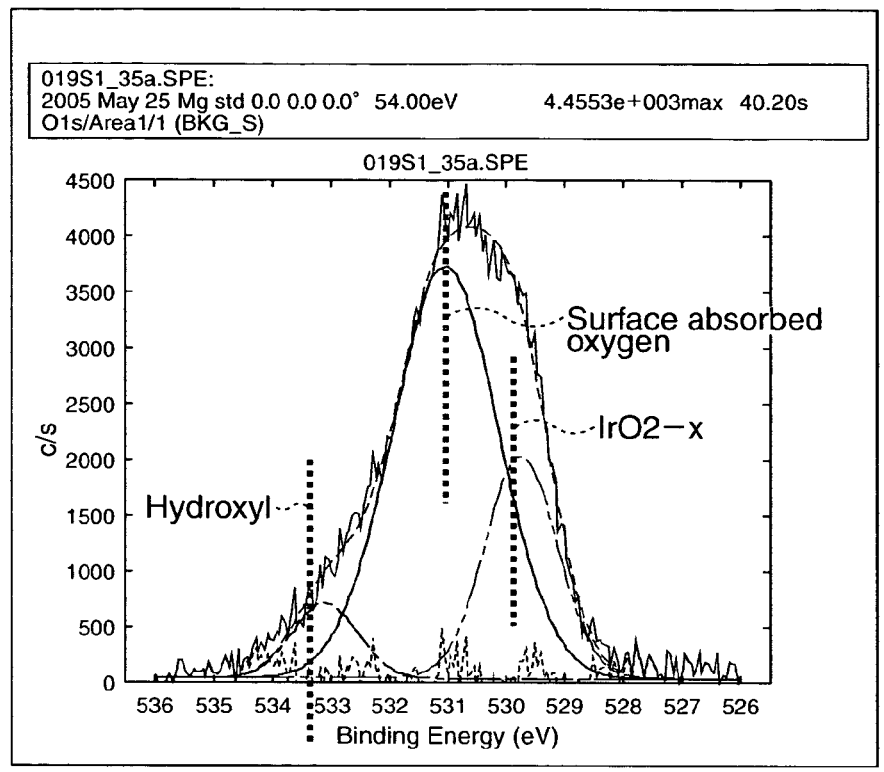
FIG. 3A and FIG. 3B are characteristic charts showing observation results by an XPS.

FIG. 3A is a characteristic chart showing an observation result by the XPS. FIG. 3A shows a result of a peak separation of an $O_{1s}$ peak. A peak noted as "Hydroxyl" indicates a peak by hydroxyl, while a peak noted as "Surface Absorbed Oxygen" indicates a peak by an oxygen atom (O) absorbed on the surface. Additionally, there is observed a peak noted as $IrO_{2-x}$ (0<x<2) on a low binding energy side, the peak being considered as an oxygen atom (O) in an Ir oxide. It is considered that this peak emerges after film formation of the Ir film being the lower electrode film due to oxidation of the surface thereof.

Based on the above consideration, after the film formation of the Ir film being the lower electrode film, the oxide generated on the Ir film surface is removed and the surface state is observed with the XPS.

Here, first, there is deposited a film which reduces the iridium oxide, in other words, a film containing a metal easier to be oxidized than iridium (Ir), for example, an aluminum oxide ($AlO_x$; 0<x<1.5) film being an oxide film easier to be oxidized than iridium (Ir). This $AlO_x$ film is the oxide film (0<x<1.5) formed in a state in which oxidation is incomplete due to deficiency in oxygen (O), compared with a complete oxide such as $Al_2O_3$, and is able to take oxygen (O) from the oxide generated on the Ir film surface. As for a technique to realize the $AlO_x$ film, a high frequency sputtering method using an $Al_2O_3$ target is carried out in an atmosphere which does not contain oxygen, for example, in an atmosphere with argon (Ar) only.

The oxide generated on the Ir film surface is reduced by this $AlO_x$ film. Thereafter, the $AlO_x$ film is removed using dilute hydrofluoric acid, for example. At this time, the Ir film surface becomes a state in which the oxide is removed (that is, a state in which the surface is iridium (Ir)). It is considered this is because when the $AlO_x$ film is removed by a dilute hydrofluoric treatment, the Ir film surface is so-called F-terminated and the surface becomes a state in which an oxide is hard to be generated.

Figure 3B:
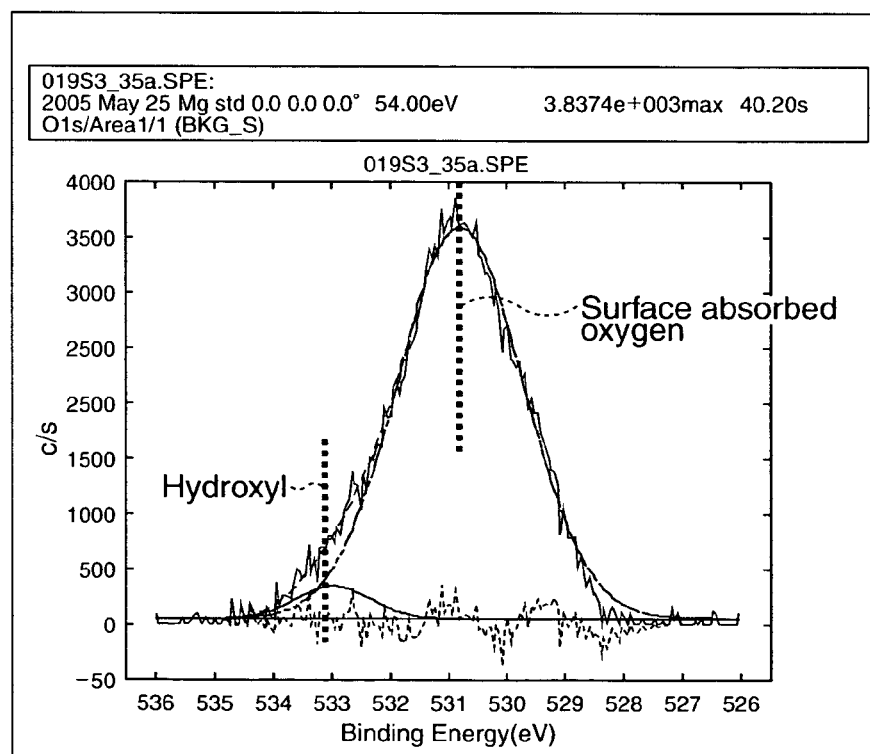

As described above, in the state in which the oxide has been removed from the Ir film surface, the surface is observed by the XPS. A result thereof is shown in FIG. 3B. Also in FIG. 3B, a result of a peak separation of an $O_{1s}$ peak is shown, as in FIG. 3A.

In FIG. 3B, unlikely in FIG. 3A, only a peak of Hydroxyl and a peak of Surface Absorbed Oxygen appear, and it is known that a peak considered to be of an Ir oxide has disappeared.

It is inferred from the above results that the Ir oxide having been existed on the surface of the Ir film being the lower electrode film is the cause to generate the Ir hillock. Therefore, due to the Ir oxide, the foreign object is generated on the Ir film being the top layer of the upper electrode film. Thus, it can be concluded that the Ir oxide is the cause of the holes generated in the film entirely formed in the layer under the ferroelectric capacitor structure which is pattern-formed by the one mask etching.

As described above, when the PZT film being the capacitor film is formed by the MOCVD method in the state in which the Ir oxide has been removed from the surface of the Ir film being the lower electrode film, abnormal growth does not occur in the PZT film. Thus, holes are not generated in the film (here, the interlayer insulating film) entirely formed in the layer under the ferroelectric capacitor structure after the one mask etching, and it becomes possible to proceed to the succeeding manufacturing process without inconvenience.

Based on the above result, as the present invention, there is presented a manufacturing method of a semiconductor device whose gist is that in pattern-forming a ferroelectric capacitor structure by a one mask etching, after a noble metal film (in the present invention, a metal having a characteristic of maintaining conductivity even when the metal itself is oxidized) to be a lower electrode film, here, an Ir film, is formed, an oxide reduction film (an $AlO_x$ film in the above example) reducing an oxide formed on a surface layer of the lower electrode film is deposited on the lower electrode film, and thereafter this oxide reduction film is removed by, for example, a dilute hydrofluoric treatment.

Here, in stead of the Ir film, a ruthenium (Ru) film can be formed as the noble metal film to be the lower electrode film. Since ruthenium (Ru), as in the case of iridium (Ir), does not form a reactant of lead (Pb) as platinum (Pt), ruthenium (Ru) is suitable as the material for the lower electrode.

Incidentally, as the oxide reduction film, here, the oxide containing the metal easier to be oxidized than iridium (Ir), the $AlO_x$ film is referred to, but there can be used an oxide of a metal whose ionization tendency is larger than that of platinum (Pt) being the noble metal whose ionization tendency is almost the same as that of iridium (Ir) and ruthenium (Ru), or a metal film thereof. Ionization tendency is a series in which metal elements are ordered in terms of easiness to be ionized in water. For example, "K, Ca, Na, Mg, Al, Zn, Fe, Ni, Sn, Pb, (H), Cu, Hg, Ag, Pt, Au" is famous. As known from this order, the lefter the metal element is in the list, the larger the ionization tendency is, that is, metals easier to be ionized is arranged in the lefter. Therefore, suitable as the material of the oxide reduction film in the present embodiment is a metal oxide in a state of incomplete oxidation of at least one kind selected from "K, Ca, Na, Mg, Al, Zn, Fe, Ni, Sn, Pb, Cu, Hg and Ag".

Meanwhile, in order to effectively remove the oxide generated on the surface of the Ir film being the lower electrode film, a heat treatment can be applied to the semiconductor substrate after the oxide reduction film is deposited, before the oxide reduction film is removed.

Specific Embodiment to which the Present Invention is Applied

Hereinafter, a specific embodiment to which the present invention is applied will be described in detail with reference to the drawings.

In the present embodiment, there is exemplified a so-called stacked type FRAM, in which continuity of a lower electrode of a ferroelectric capacitor structure is obtained beneath the lower electrode and continuity of an upper electrode is obtained above the upper electrode, respectively. Incidentally, for the sake of convenience in description, a structure of the FRAM will be described along with a manufacturing method thereof.

FIG. 4A to FIG. 11 are schematic cross-sectional views showing a configuration of the FRAM according to the present embodiment along with the manufacturing method thereof step by step.

Figure 4A:
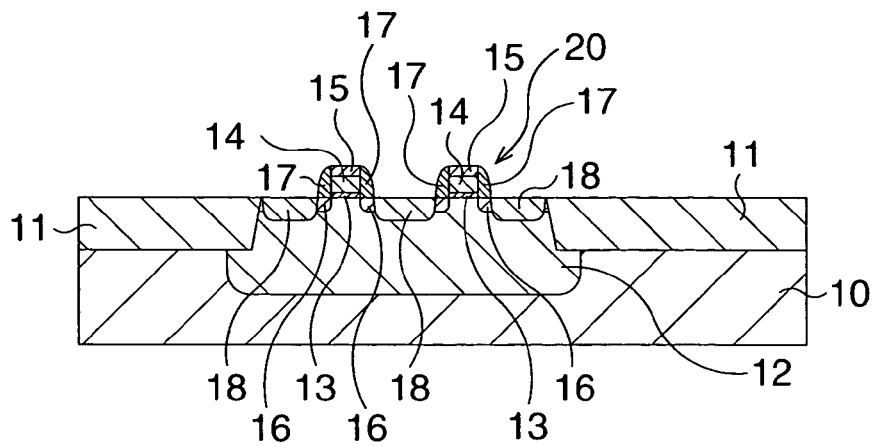
FIG. 4A, FIG. 4B and FIG. 4C are schematic cross-sectional views showing a configuration of an FRAM according to the present embodiment along with a manufacturing method thereof step by step.

First, as shown in FIG. 4A, a MOS transistor 20 functioning as a selection transistor is formed on a silicon semiconductor substrate 10.

More specifically, an element isolation structure 11 is formed on a surface layer of the silicon semiconductor substrate 10 by an STI (Shallow Trench Isolation) method, for example, to define an element active region.

Next, an impurity, here, boron (B) is ion-implanted into the element active region under a condition of a dose amount of $3.0 \times 10^{13}/cm^2$ and an acceleration energy of 300 keV, for example, to form a well 12.

Next, a thin gate insulating film 13 of about 3.0 nm in film thickness is formed in the element active region by a thermal oxidation or the like, a polycrystalline silicon film of about 180 nm in film thickness and, for example, a silicon nitride film of about 29 nm in film thickness are deposited on the gate insulating film 13 by a CVD method, and then the silicon nitride film, the polycrystalline silicon film and the gate insulating film 13 are processed to an electrode shape by a lithography and a subsequent dry etching, to pattern-form an electrode 14 on the gate insulating film 13. At this time, a cap film 15 made of a silicon nitride film is pattern-formed simultaneously on the gate electrode 14.

Next, with the cap film 15 being a mask, an impurity, here, arsenic (As), is ion-implanted into the element active region under a condition of a dose amount of $5.0 \times 10^{14}/cm^2$ and an acceleration energy of 10 keV, for example, to form a so-called LDD region 16.

Next, a silicon oxide film, for example, is deposited on the entire surface by the CVD method, and by so-called etching-back this silicon oxide film, a sidewall insulating film 17 is formed, leaving the silicon oxide film only on side surfaces of the gate electrode 14 and the cap film 15.

Next, with the cap film 15 and the sidewall insulating film 17 being masks, an impurity, here, phosphorus (P), is ion-implanted into the element active region under a condition in which an impurity concentration is higher than in the LDD region 16, to form a source/drain region 18 overlapped with the LDD region 16, so that the MOS transistor 20 is completed.

Figure 4B:
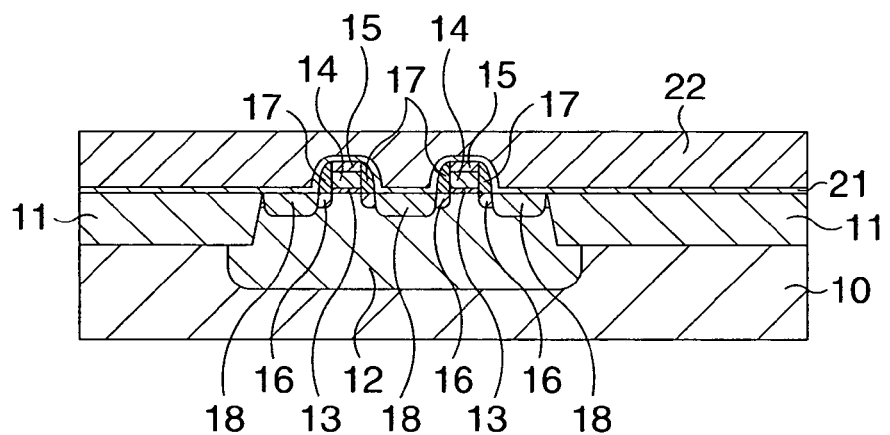

Subsequently, as shown in FIG. 4B, a protective film 21 of the MOS transistor 21 and an interlayer insulating film 22 are sequentially formed.

More specifically, the protective film 21 and the interlayer insulating film 22 are sequentially formed in a manner to cover the MOS transistor 20. Here, as the protective film 21, a silicon nitride film being a material is deposited by the CVD method to be about 130 nm in film thickness. As the interlayer insulating film 22, a plasma TEOS film (about 1300 nm in film thickness), for example, is formed and is polished to be about 700 nm in film thickness by a CMP.

Figure 4C:
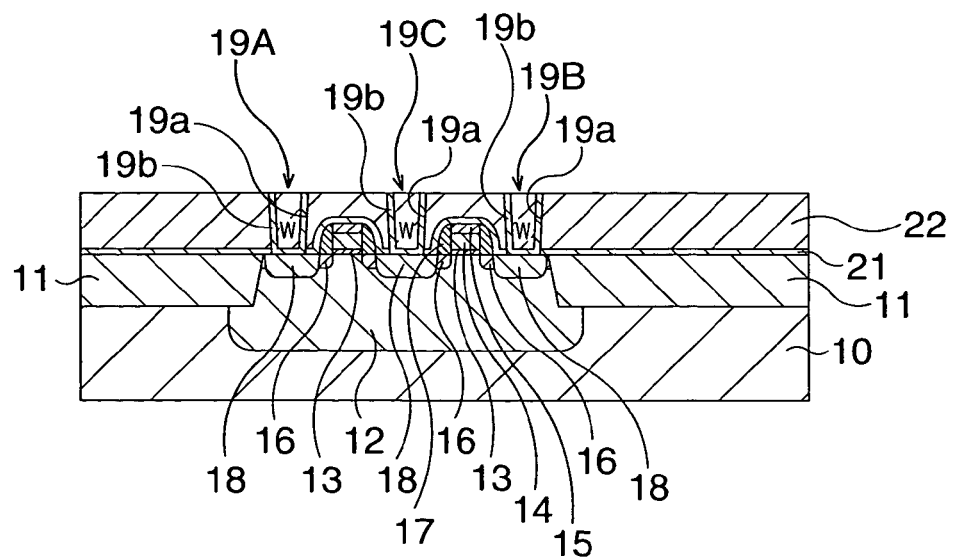

Subsequently, as shown in FIG. 4C, conductive plugs 19A, 19B, 19C connected to the source/drain regions 18 of the transistor structures 20 are formed.

More specifically, first, with respective source/drain regions 18 being etching stoppers, the interlayer insulating film 22 and the protective film 21 are processed by the lithography and a subsequent dray etching until parts of surfaces of the respective source/drain regions 18 are exposed, to form via holes 19a of about 0.3 μm in diameter, for example, respectively.

Next, a Ti film and a TiN film, for example, are sequentially deposited to be about 20 nm in film thickness and about 50 nm in film thickness by a sputtering method in a manner to cover wall surfaces of the respective via holes 19a, to form base films (glue films) 19b. Then, W films, for example, are deposited by the CVD method in a manner to fill the respective via holes 19a via the glue films 19b. Subsequently, with the interlayer insulating film 22 being a polishing stopper, the W films and the glue films 19b are polished by the CMP, to simultaneously form the conductive plugs 19A, 19B, 19C respectively in which the respective via holes 19a are filled with tungsten (W) via the glue films 19b. After the CMP, a plasma annealing treatment of $N_2O$, for example, is carried out.

Figure 5A:
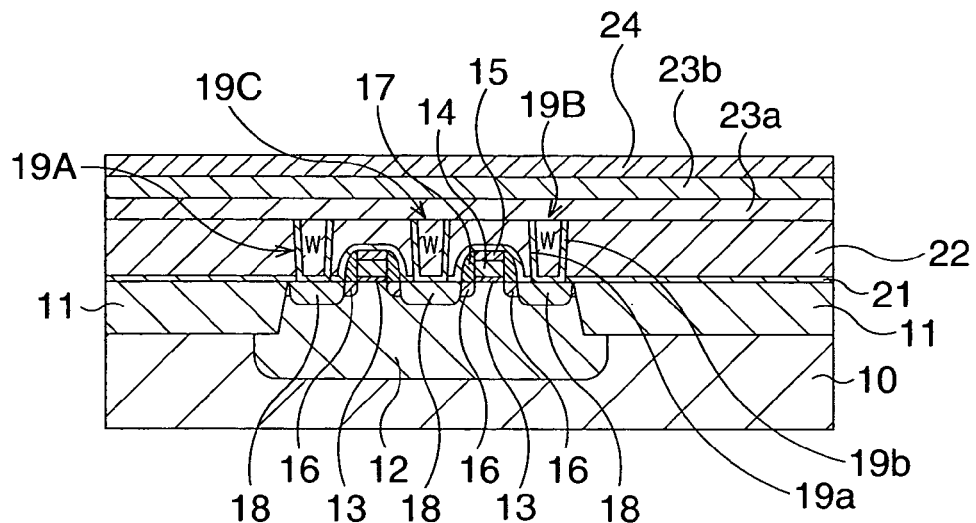
FIG. 5A, FIG. 5B and FIG. 5C are schematic cross-sectional views, continued from FIG. 4C, showing the configuration of the FRAM according to the present embodiment along with the manufacturing method thereof step by step.

Subsequently, as shown in FIG. 5A, an orientation property improving film 23a, an oxygen barrier film 23b and a lower electrode film 24 are sequentially formed.

More specifically, first, titanium (Ti), for example, is deposited to be about 20 nm in film thickness in order to improve an orientation property of a capacitor film in a ferroelectric capacitor structure described later. Since titanium has a characteristic of strong self-orientation property, a titanium film with good crystallinity is formed on the conductive plugs 19A, 19B, 19C and the interlayer insulating film 22. Subsequently, the Ti film is nitrified to be TiN by a rapid thermal annealing (RTA) treatment in an $N_2$ atmosphere, to form the conductive orientation property improving film 23a. A condition of the RTA treatment is, for example, that a substrate temperature is 650° C., a nitrogen flow rate is 10 slm (standard liter/min, $1.013 \times 10^5$ Pa, 0° C.), and a treatment time is about 120 seconds. As for the orientation property improving film 23a, since crystallinity of the titanium film is good before nitrification, crystallinity of the orientation property improving film 23a being a TiN film to which the titanium film 23a is nitrified is also good.

Next, TiAlN is deposited to be about 100 nm in film thickness on the orientation property improving film 23a by, for example, the sputtering method, to form a conductive oxygen barrier film 23b.

Next, iridium (Ir) is deposited to be about 100 nm, for example, in film thickness by the sputtering method to form the lower electrode film 24. It is preferable that a film formation temperature of the Ir film is as high as possible in order to improve crystallinity. Therefore, due to formation of the lower electrode film 24 at the high film formation temperature, for example, 500° C., a surface of the lower electrode film 24 becomes easier to be oxidized when the silicon semiconductor substrate 10 is retrieved into an atmosphere after the film formation. Incidentally, as the lower electrode film 24, a noble metal other than platinum (Pt), for example, ruthenium (Ru), can be deposited in stead of iridium (Ir), among metals having characteristics of maintaining conductivity even when the metals themselves are oxidized. In a case that the lower electrode film 24 is formed of ruthenium (Ru), a surface thereof becomes easier to be oxidized by contacting the atmosphere after the film formation, similarly to the above.

Figure 5B:
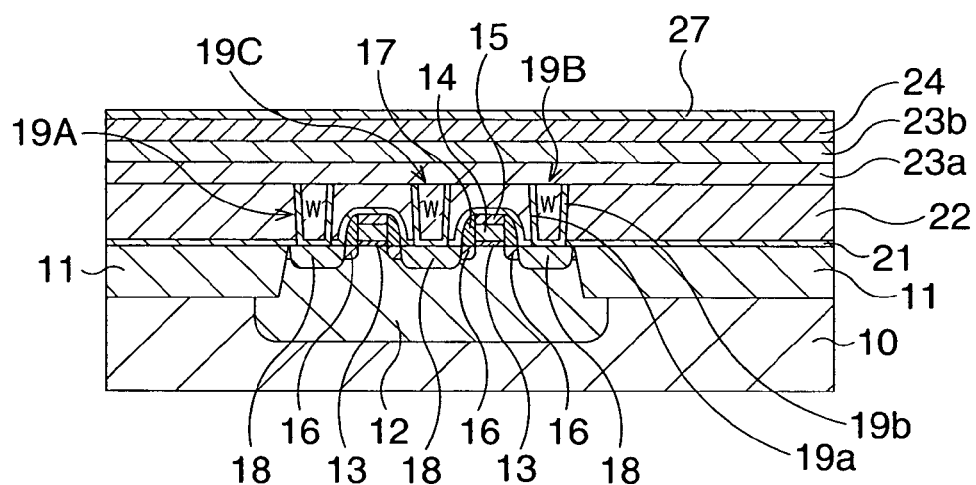

Subsequently, as shown in FIG. 5B, an oxide reduction film 27 is formed on the lower electrode film 24.

More specifically, an $AlO_x$ film (0<x<1.5) is deposited on the lower electrode film 24 by an RF sputtering method in an atmosphere of only inactive gas, for example, argon (Ar), to form the oxide reduction film 27. The oxide reduction film 27 is formed in a manner that its film thickness is about 20 nm, for example. Here, as a target material for the RF sputtering, an aluminum oxide ($Al_2O_3$) is used.

The oxide reduction film 27 is formed by the RF sputtering method of the argon atmosphere only. By using such a method, aluminum (Al) composition is increased stoichimetrically in the oxide reduction film 27. As described above, by forming the oxide reduction film 27 with much oxygen deficiency on the lower electrode film 24, an iridium oxide generated on a surface of the oxide reduction film 27 can be reduced (practically, the iridium oxide is removed and the surface of the oxide reduction film 27 is made to be iridium (Ir)).

Incidentally, as the oxide reduction film 27, the $AlO_x$ film as the oxide containing metal which is easier to be oxidized than iridium (Ir) is referred to, but there can be used, instead of $AlO_x$, a metal whose ionization tendency is larger than that of platinum (Pt) being the noble metal whose ionization tendency is almost the same as that of iridium (Ir) and ruthenium (Ru), or an oxide in a state of incomplete oxidation of such a metal. As such a metal, to be more precise, at least one kind selected from K, Ca, Na, Mg, Al, Zn, Fe, Ni, Sn, Pb, Cu, Hg and Ag is suitable.

Figure 5C:
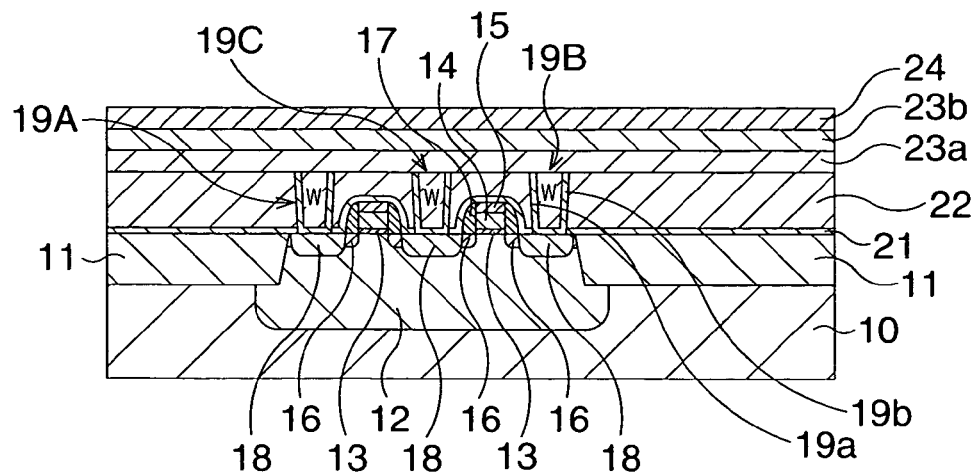

Subsequently, as shown in FIG. 5C, the oxide reduction film 27 is removed.

More specifically, the oxide reduction film 27 is removed from on the lower electrode film 24, using dilute hydrofluoric acid, for example. Since this oxide reduction film 27 is Al-rich $AlO_x$, it can be easily removed using dilute hydrofluoric acid, for example. Meanwhile, in order to effectively carry out reduction of the iridium oxide by the oxide reduction film 27 (in a sense that oxygen is taken from the iridium oxide), a heat treatment can be applied before the removal of the oxide reduction film 27. More particularly, a furnace annealing is carried out to the silicon semiconductor substrate 10 at 400° C. for about 30 minutes.

Figure 6A:
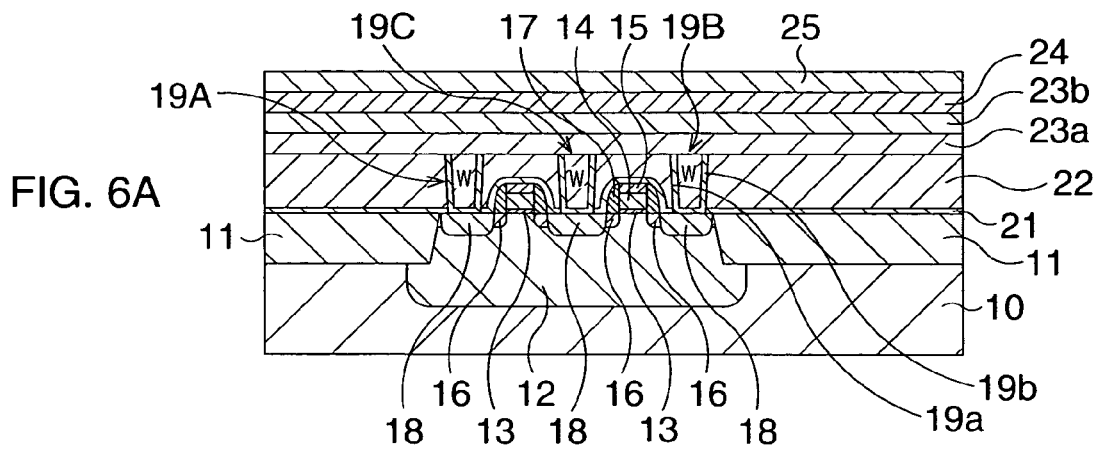
FIG. 6A, FIG. 6B and FIG. 6C are schematic cross-sectional views, continued from FIG. 5C, showing the configuration of the FRAM according to the present embodiment along with the manufacturing method thereof step by step.

Subsequently, as shown in FIG. 6A, a capacitor film 25 is formed on the lower electrode film 24 from which the Ir oxide has been removed.

More specifically, first, a PZT film being a first layer is formed to be about 5 nm in film thickness by the MOCVD method, and further thereon, a PZT film being a second layer is formed to be about 115 nm in film thickness by the MOCVD method, to form the capacitor film 25 of 120 nm in total film thickness. Incidentally, the capacitor film 25 is illustrated as having one layer structure, for the sake of convenience in illustration. As film forming conditions of the respective PZT films, a substrate temperature is, for example, 620° C. and a pressure is about $6.67 \times 10^2$ Pa.

Here, the PZT films of the first layer and the second layer have the same compositions. It should be noted, however, that the first layer is formed at a lower partial pressure of oxygen. This is because crystallinity of the PZT film itself is better when formed at the low partial pressure of oxygen. However, if the second layer is also formed at the low partial pressure of oxygen, oxygen deficit in the PZT film becomes large and a leak current increases, and therefore, here, a two stage growth method in which film forming conditions of the first layer and the second layer are different is adopted.

Figure 6B:
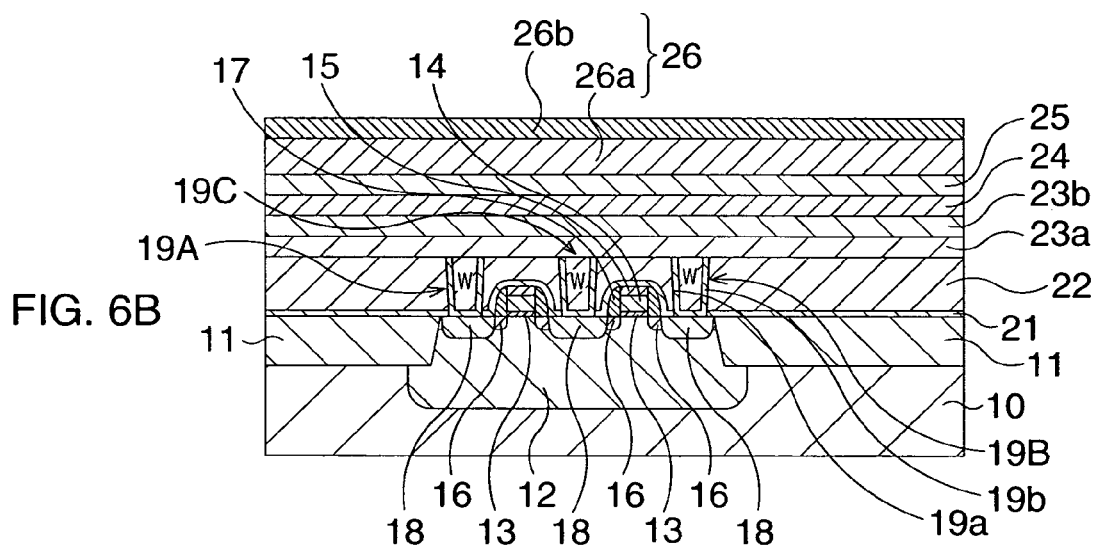

Subsequently, as shown in FIG. 6B, an iridium oxide film 26a and an Ir film 26b being components of an upper electrode film 26 are sequentially formed on the capacitor film 25.

More specifically, first, the iridium oxide is deposited to be about 150 nm in film thickness by the sputtering method, to form the iridium oxide film 26a.

Next, iridium (Ir) is deposited to be about 100 nm in film thickness on the iridium oxide film 26a by the sputtering method, to form the Ir film 26b. The iridium oxide film 26a and the Ir film 26b constitute the upper electrode film 26.

Figure 6C:
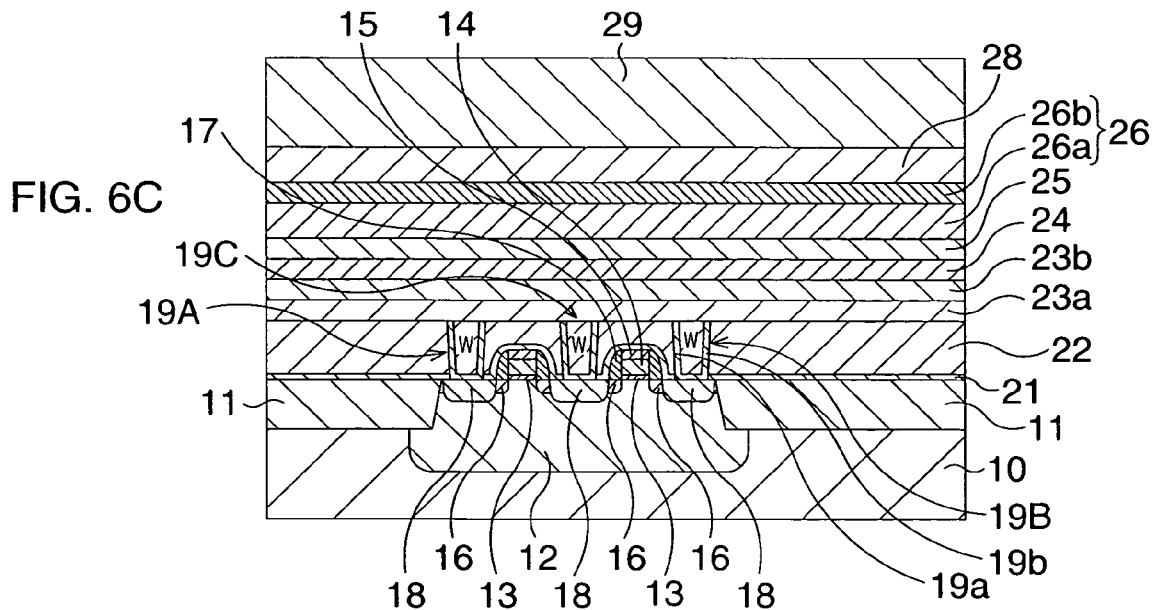

Subsequently, as shown in FIG. 6C, a TiN film 28 and a silicon oxide film 29 are formed.

More specifically, the TiN film 28 is deposited and formed to be about 200 nm in film thickness on the upper electrode film 26 by the sputtering method or the like. The silicon oxide film 29 is deposited and formed to be about 700 nm in film thickness on the TiN film 28 by the CVD method using TEOS, for example. Here, an HDP film can be formed instead of a TEOS film.

Figure 7A:
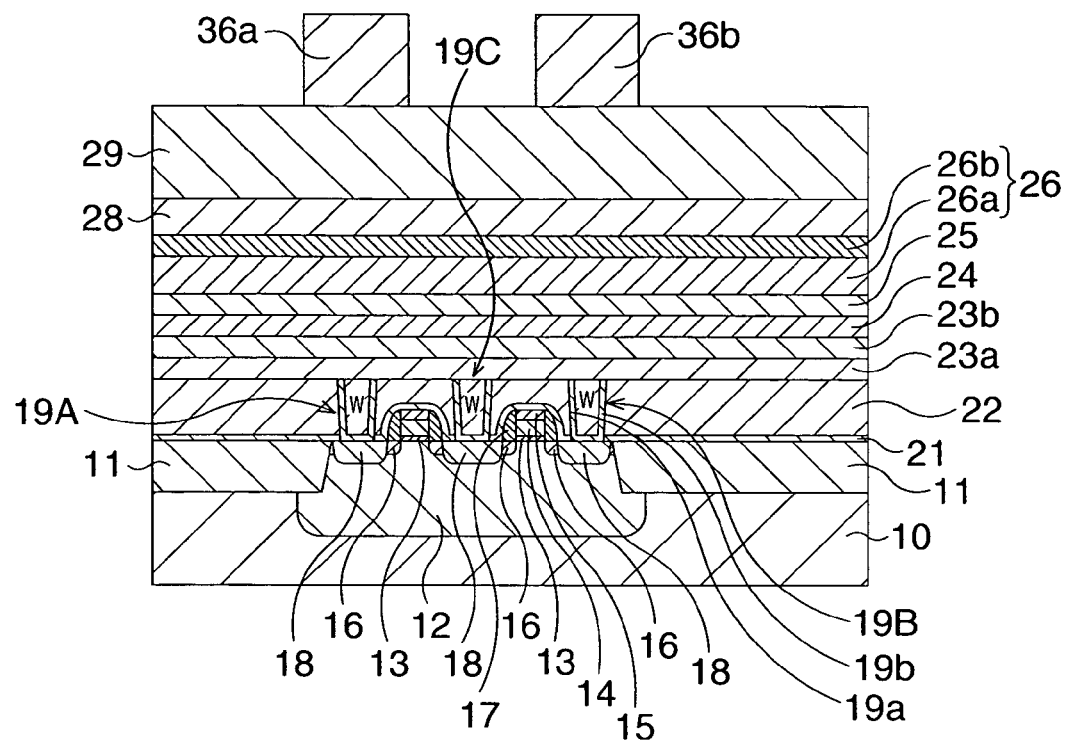
FIG. 7A and FIG. 7B are schematic cross-sectional views, continued from FIG. 6C, showing the configuration of the FRAM according to the present embodiment along with the manufacturing method thereof step by step.

Subsequently, as shown in FIG. 7A, resist masks 36a, 36b are formed.

More specifically, resist is applied on the silicon oxide film 29 and this resist is processed to be electrode shapes by the lithography, to form respective resist masks 36a, 36b. Here, one resist mask 36a is formed on a position aligned with the conductive plug 19A therebelow, and the other resist mask 36b is formed on a position aligned with the conductive plug 19B therebelow, respectively.

Figure 7B:
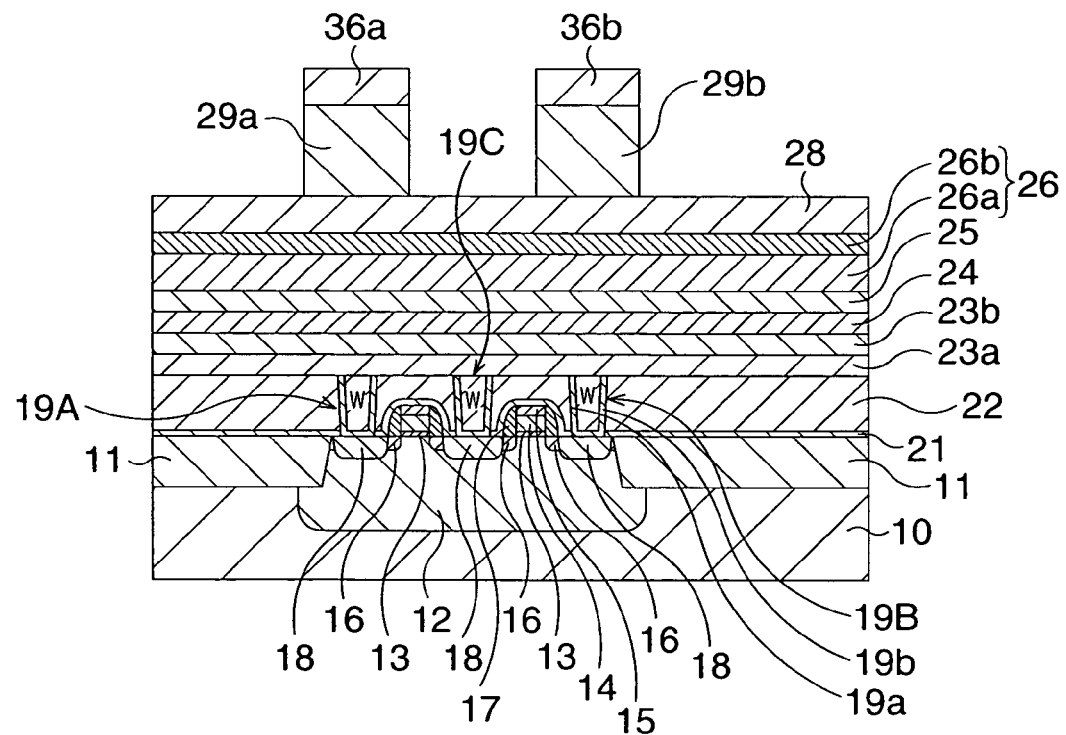

Subsequently, as shown in FIG. 7B, the silicon oxide film 29 is processed.

More specifically, with the resist masks 36a, 36b being masks, the silicon oxide film 29 is dry-etched. At this time, the silicon oxide film 29 is patterned in accordance with the electrode shapes of the resist masks 36a, 36b, so that the hard masks 29a, 29b are formed. The resist masks 36a, 36b are etched and thicknesses thereof are decreased.

Figure 8A:
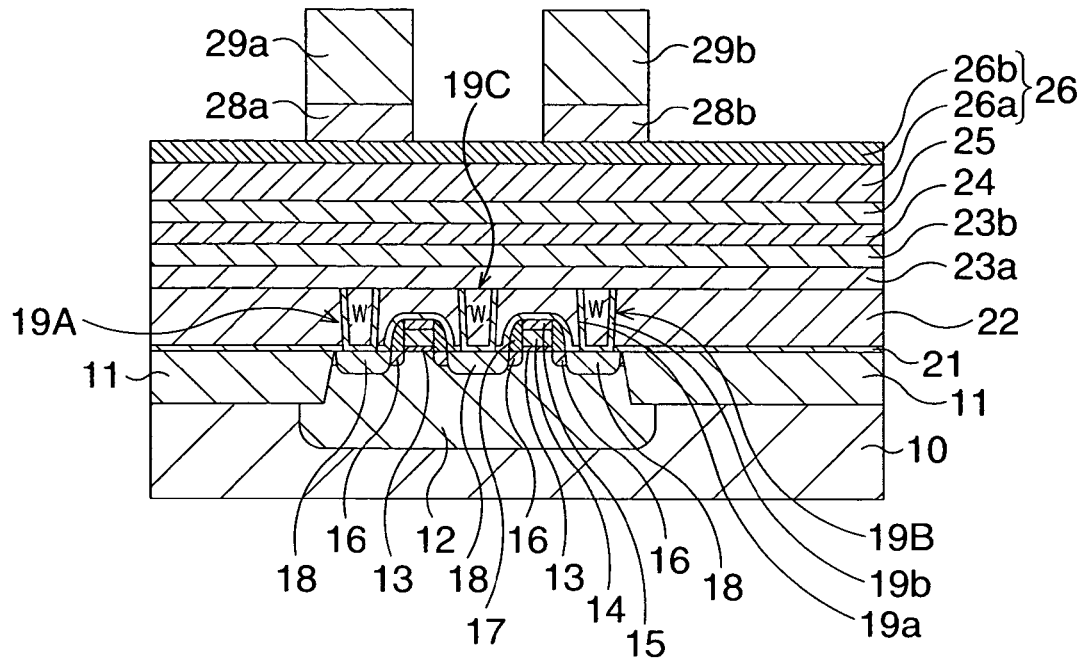
FIG. 8A and FIG. 8B are schematic cross-sectional views, continued from FIG. 7B, showing the configuration of the FRAM according to the present embodiment along with the manufacturing method thereof step by step.

Subsequently, as shown in FIG. 8A, the TiN film 28 is processed.

More specifically, with the resist masks 36a, 36b and the respective hard masks 29a, 29b being masks, the TiN film 28 is dry-etched. At this time, the TiN film 28 is patterned in accordance with the electrode shapes of the hard masks 29a, 29b, so that the hard masks 28a, 28b are formed. Thicknesses of the resist masks 36a, 36b are decreased since the resist masks 36a, 36b themselves are etched during the etching. Subsequently, the resist masks 36a, 36b are removed by an ashing or the like.

Figure 8B:
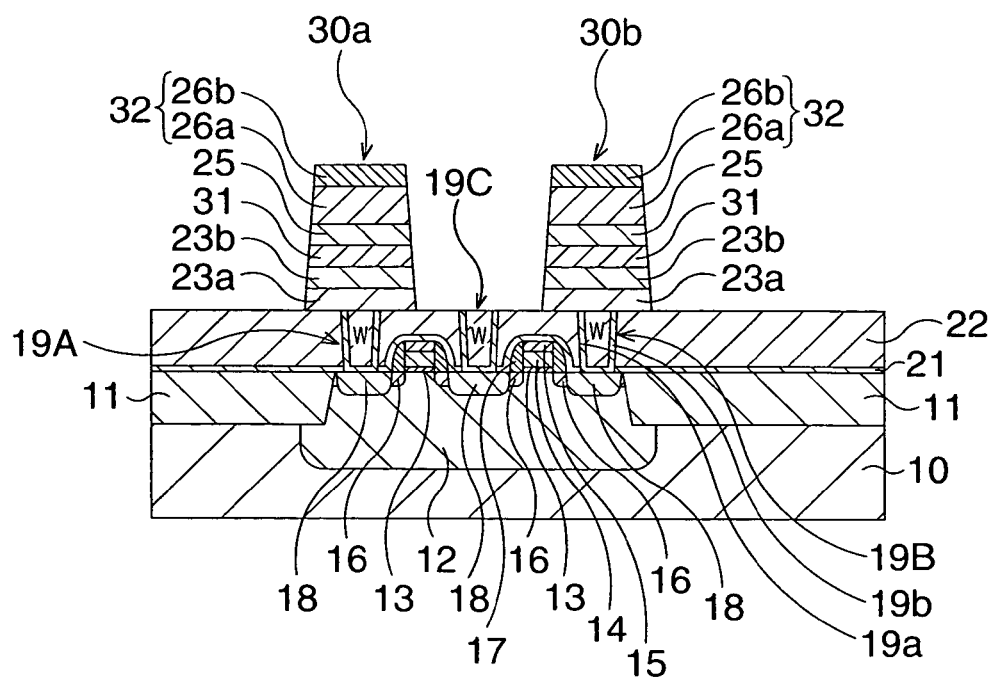

Subsequently, as shown in FIG. 8B, after the upper electrode film 26, the capacitor film 25 and the lower electrode film 24 are collectively etched, the oxygen barrier film 23b and the orientation property improving film 23a are etched, so that ferroelectric capacitor structures 30a, 30b are completed.

More specifically, with the hard masks 28a, 28b and the hard masks 29a, 29b being masks, first, the upper electrode film 26, the capacitor film 25 and the lower electrode film 24 are collectively dry-etched (one mask etching) with the oxygen barrier film 23b being an etching stopper. Then, after the hard masks 29a, 29b made of the silicon oxide film are etched and removed by the entire dry etching (etch back), the hard masks 28a, 28b made of TiN are similarly etched and removed as the oxygen barrier film 23b and the orientation property improving film 23a are processed by the dry etching. By these dry etchings, the upper electrode film 26, the capacitor film 25, the lower electrode film 24, the oxygen barrier film 23b and the orientation property improving film 23a are patterned in accordance with the electrode shapes of the hard masks 28a, 28b.

At this time, the respective ferroelectric capacitor structures 30a, 30b are completed in which the capacitor film 25 and an upper electrode 32 are sequentially stacked on a lower electrode 31, and the lower electrode 31 and the upper electrode 32 are capacitively coupled via the capacitor film 25.

Here, in the ferroelectric capacitor structure 30a in the left side in the drawing, the lower electrode 31 is connected to the conductive plug 19A via the conductive orientation property improving film 23a and the oxygen barrier film 23b, and the source/drain 18 and the lower electrode 31 are electrically connected via the conductive plug 19A, the orientation property improving film 23a and the oxygen barrier film 23b. On the other hand, in the ferroelectric capacitor structure 30b in the right side in the drawing, the lower electrode 31 is connected to the conductive plug 19B via the conductive orientation property improving film 23a and the oxygen barrier film 23b, and the source/drain 18 and the lower electrode 31 are electrically connected via the conductive plug 19B, the orientation property improving film 23a and the oxygen barrier film 23b.

The above-described one mask etching is a technology in which allowance for alignment of respective layers is not necessary and enables miniaturization of the ferroelectric capacitors 30a, 30b.

As described above, in the present embodiment, since the iridium oxide generated on the surface of the lower electrode film 24 is reduced and removed and the capacitor film 25 and the upper electrode film 26 are stacked in a state that the surface is plane without the Ir hillock, the foreign object is not generated on the surface of the upper electrode film 26, so that the surface becomes homogenous. Since the one mask etching is carried out in such a stacked state of the respective layers, a good one mask etching is realized without generating the hole in the interlayer insulating film 22 and the like, so that desired highly integrated ferroelectric capacitors 30a, 30b can be obtained.

Figure 9A:
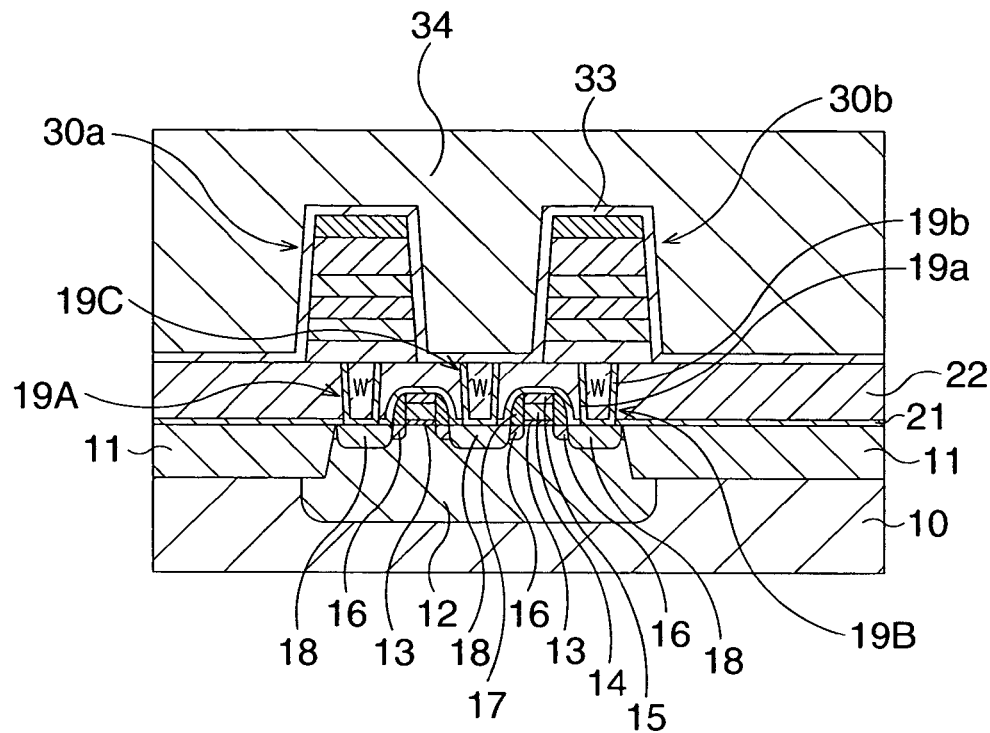
FIG. 9A and FIG. 9B are schematic cross-sectional views, continued from FIG. 8B, showing the configuration of the FRAM according to the present embodiment along with the manufacturing method thereof step by step.

Subsequently, as shown in FIG. 9A, a protective film 33 and an interlayer insulating film 34 are formed.

More specifically, first, alumina ($Al_2O_3$) as a material is deposited to be about 20 nm to 50 nm, for example about 40 nm, in film thickness by an atomic layer deposition (ALD) in a manner to cover the entire surface of the ferroelectric capacitor structures 30a, 30b, to form the protective film 33.

Next, the interlayer insulating film 34 is formed in a manner to cover the ferroelectric capacitor structures 30a, 30b via the protective film 33. Here, as for the interlayer insulating film 34, after a silicon oxide film is deposited to be about 1500 nm to 2500 nm in film thickness by a plasma CVD method using TEOS, for example, the silicon oxide film is polished to be, for example, about 1000 nm in film thickness by the CMP to form interlayer insulating film 34. After the CMP, the plasma annealing treatment of $N_2O$, for example, is carried out in order to dehydrate the interlayer insulating film 34.

Figure 9B:
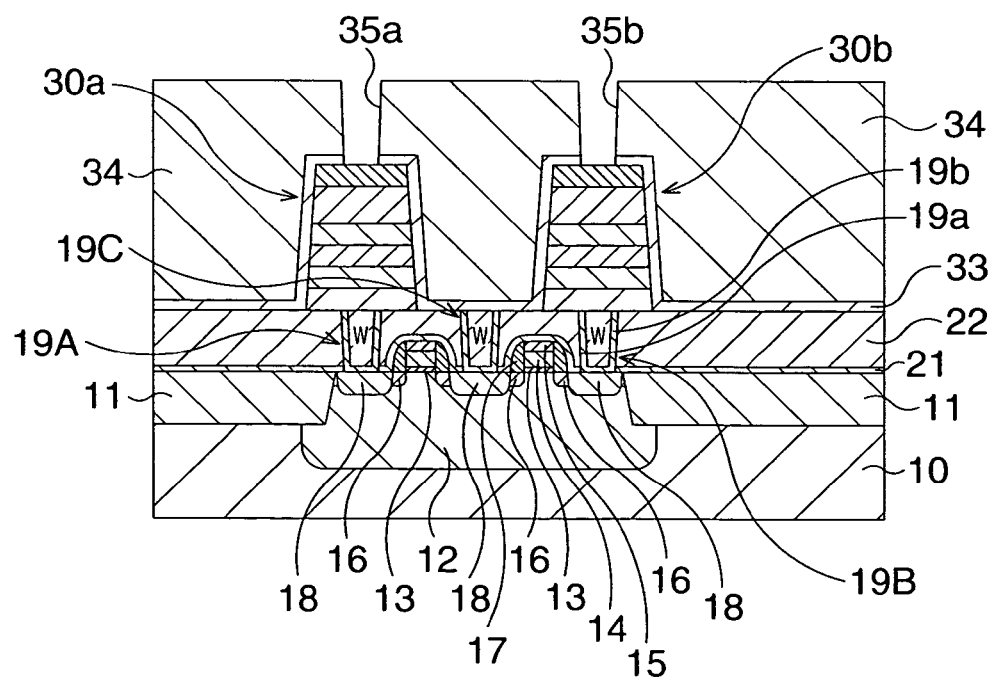

Subsequently, as shown in FIG. 9B, via holes 35a, 35b to the upper electrodes 32 of the ferroelectric capacitor structures 30a, 30b are formed.

More specifically, the interlayer insulating film 34 and the protective film 33 are patterned by the lithography and the subsequent dry etching, to form the via holes 35a, 35b exposing parts of surfaces of the respective upper electrodes 32.

Figure 10A:
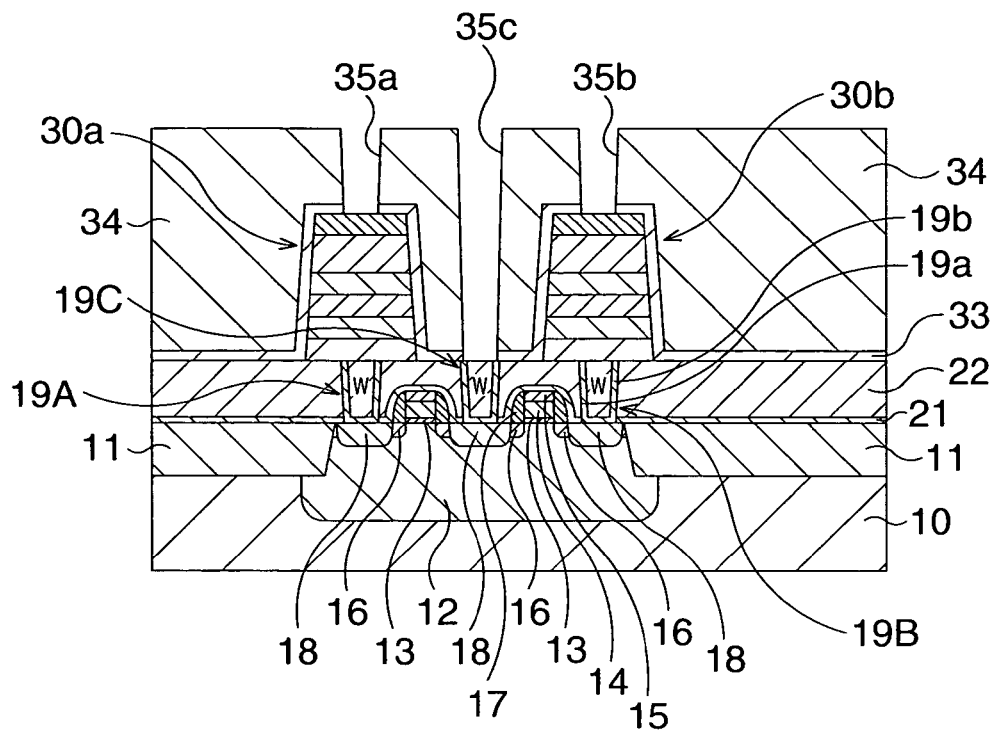
FIG. 10A and FIG. 10B are schematic cross-sectional views, continued from FIG. 9B, showing the configuration of the FRAM according to the present embodiment along with the manufacturing method thereof step by step.

Subsequently, as shown in FIG. 10A, a via hole 35c to the conductive plug 19C is formed.

More specifically, the interlayer insulating film 34 and the protective film 33 are patterned by the lithography and the subsequent dry etching, to form the via hole 35c exposing a part of a surface of the conductive plug 19C.

Figure 10B:
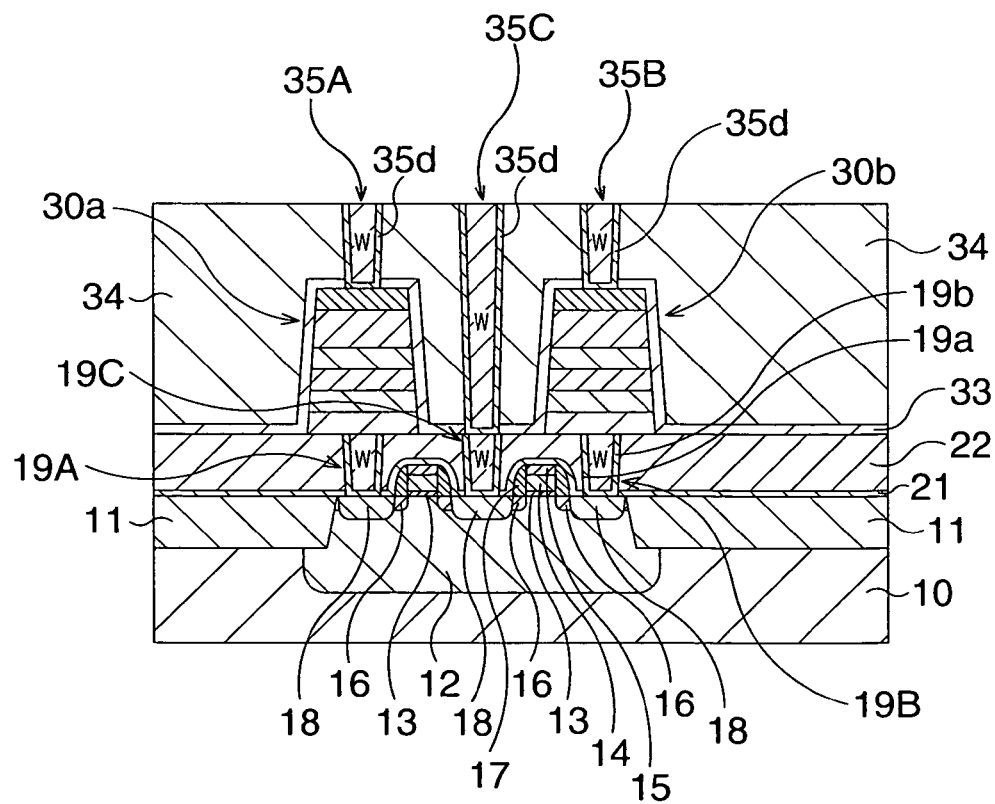

Subsequently, as shown in FIG. 10B, conductive plugs 35A, 35B connected to the upper electrodes 32 of the ferroelectric capacitor structures 30a, 30b and a conductive plug 35C connected to the conductive plug C are simultaneously formed.

More specifically, first, after base films (glue films) 35d are formed in a manner to cover wall surfaces of the via holes 35a, 35b, 35c, W films are formed by the CVD method in a manner to fill the via holes 35a, 35b, 35c via the glue film 35d. Then, with the interlayer insulating film 34 being a stopper, the W films and the glue films 35d are polished by the CMP, for example, to form the conductive plugs 35A, 35B, 35C filling inside the via holes 35a, 35b, 35c with tungsten (W) via the glue films 35. After the CMP, the plasma annealing treatment of $N_2O$, for example, is carried out.

Figure 11:
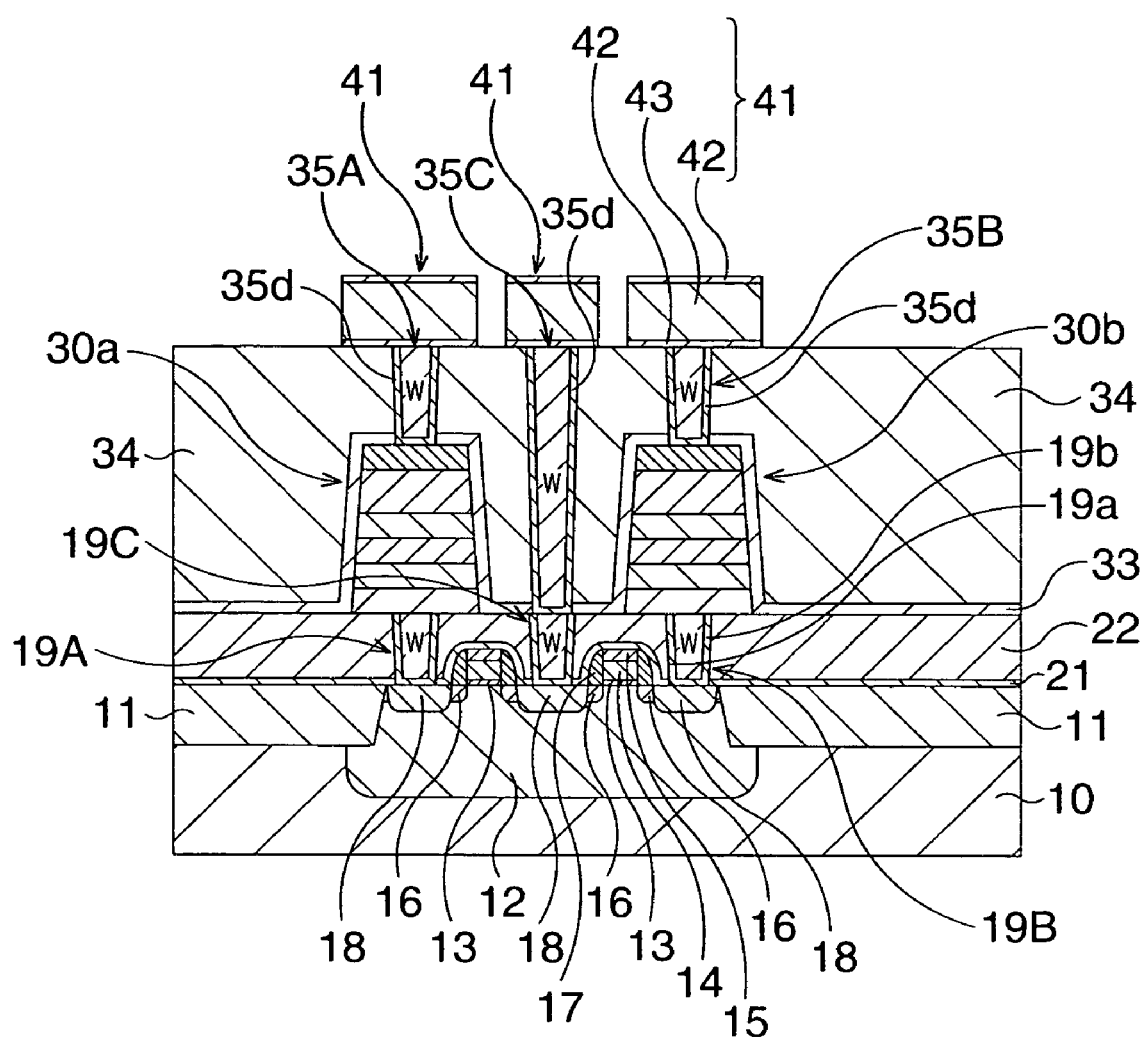
FIG. 11 is a schematic cross-sectional view, continued from FIG. 10B, showing the configuration of the FRAM according to the present embodiment along with the manufacturing method thereof step by step.
Figure 12A:
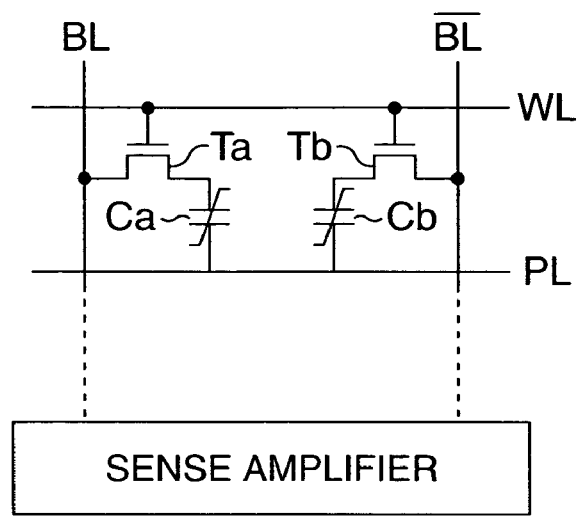
FIG. 12A and FIG. 12B are circuit views showing circuit configurations of the FRAM.
Figure 12B:
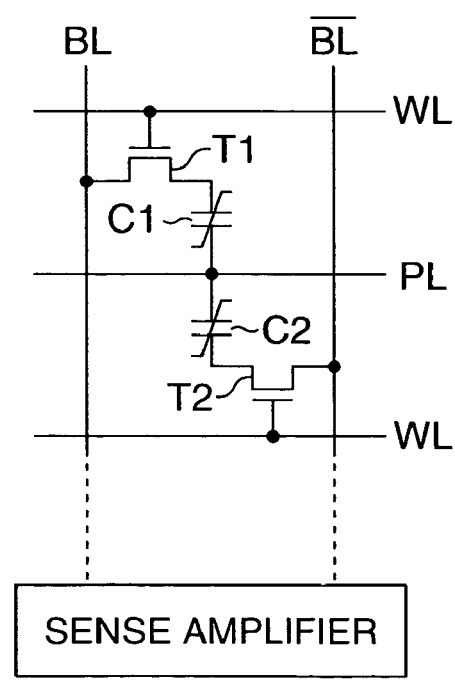
Figure 13:
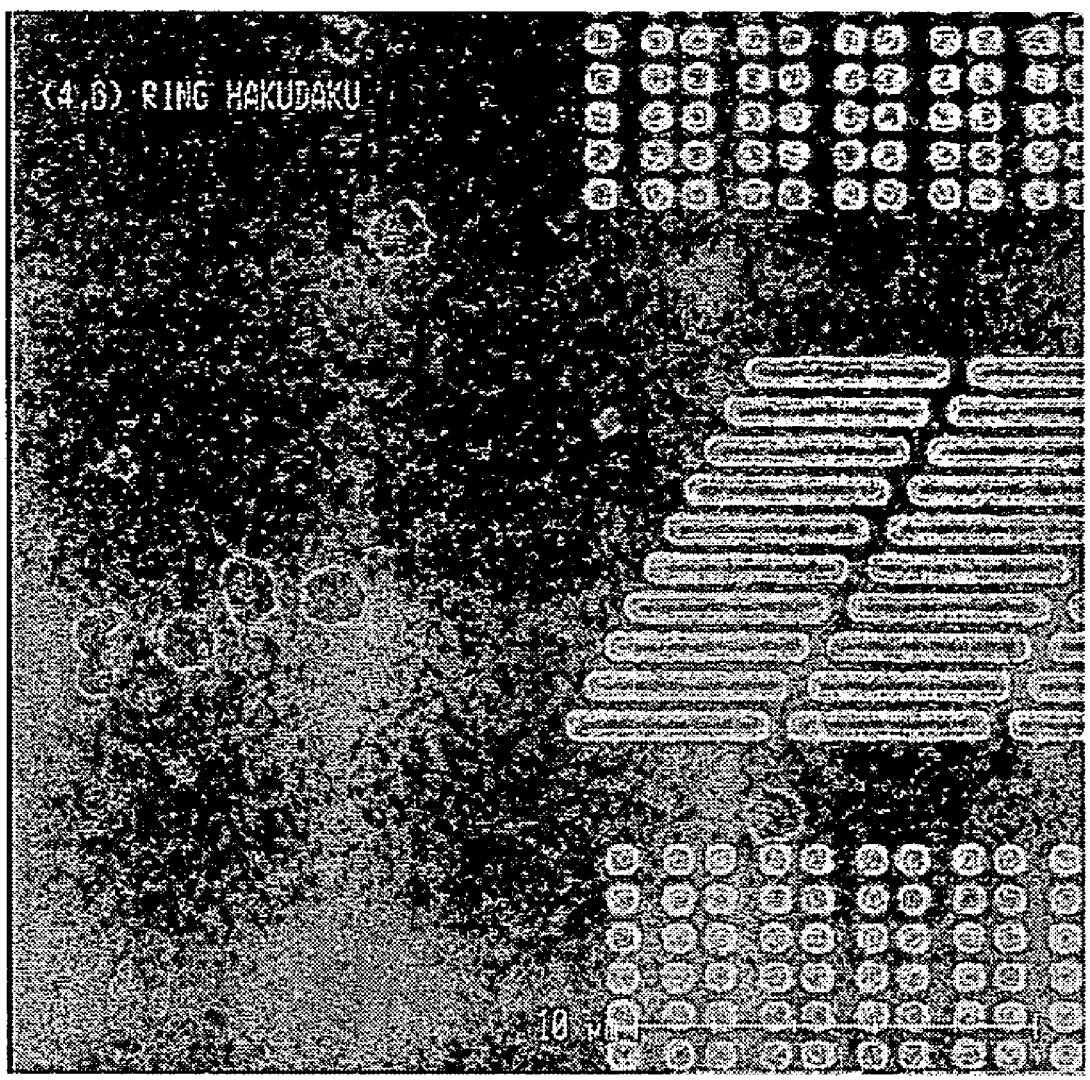
FIG. 13 is a view showing a photograph, by the electron microscope, of a surface state of an TiAlN film after the one mask etching.

Subsequently, as shown in FIG. 11, respective wirings 41 connected to the conductive plugs 35A, 35B, 35C respectively are formed.

More specifically, first, a barrier metal film 42, a wiring film 43 and a barrier metal film 44 are deposited on the entire surface of the interlayer insulating film 34 by the sputtering method or the like. As the barrier metal film 42, for example, a Ti film and a TiN film are formed in a stacked manner to be about 60 nm in film thickness and about 30 nm in film thickness respectively by the sputtering method. As the wiring film 43, for example, an Al alloy film (here, Al—Cu film) is formed to be about 400 nm in film thickness. As the barrier metal film 44, for example, a Ti film and a TiN film are formed in a stacked manner to be about 5 nm in film thickness and about 70 nm in film thickness respectively. Here, since a structure of the wiring film 43 is the same as a structure of a logic part other than the FRAM of the same rule, there is no problem in wiring processing and reliability.

Next, as an anti-reflection film, a SiON film or an anti-reflection film (not shown), for example, is formed, and then the anti-reflection film, the barrier metal film 44, the wiring film 43 and the barrier metal film 42 are processed to be wiring shapes by the lithography and the subsequent dry etching, to pattern-form the respective wirings 41 connected to the conductive plugs 35A, 35B, 35C, respectively. Incidentally, instead of forming the Al alloy film as the wiring film 43, a Cu film (or Cu alloy film) can be formed using a so-called damascene method or the like to form Cu wirings as the wirings 41.

Thereafter, through various processes such as formation of an interlayer insulating film and a further upper wiring, the stacked type FRAM according to the present embodiment is completed.

As described above, according to the present embodiment, in the stacked type FRAM, since the PZT film can be grown as the capacitor film 25 by the MOCVD method in a state without the iridium oxide having existed on the surface of the Ir film being the lower electrode film 24, PZT does not grow abnormally, so that there is not a possibility that the foreign object or the like is generated on the top layer (here, Ir film 26b) at the time of the one mask etching. Therefore, it becomes possible to form the ferroelectric capacitor structures 30a, 30b by the one mask etching, and desired high integration is realized. As a consequence, the FRAM having the highly integrated ferroelectric capacitor structures 30a, 30b can be obtained.

According to the present invention, even when a one mask etching is carried out at the time of formation of the ferroelectric capacitor structure in order to realize high integration of a semiconductor device, a surface state of a film entirely formed in a layer under a pattern-formed ferroelectric capacitor structure, here, an interlayer insulating film, is maintained to be good, so that a semiconductor device with high reliability can be obtained.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A manufacturing method of a semiconductor device having a capacitor structure in which a capacitor film made of a ferroelectric material is sandwiched by a lower electrode and an upper electrode above a semiconductor substrate, said manufacturing method comprising the steps of:
   after forming a lower electrode film to be the lower electrode, depositing on the lower electrode film an oxide reduction film reducing an oxide formed on a surface layer of the lower electrode film;
   removing the oxide reduction film on the lower electrode film;
   after removing the oxide reduction film, forming the capacitor film over the lower electrode film; and
   forming the upper electrode over the capacitor film.

2. The manufacturing method of the semiconductor device according to claim 1, wherein the lower electrode film is formed of a metal having a characteristic of maintaining conductivity even when the metal itself is oxidized.

3. The manufacturing method of the semiconductor device according to claim 2, wherein the lower electrode film is formed of iridium (Ir) or ruthenium (Ru).

4. The manufacturing method of the semiconductor device according to claim 1, wherein the oxide reduction film is formed as a material containing a metallic element whose ionization tendency is larger than an ionization tendency of the metal being a material of the lower electrode film.

5. The manufacturing method of the semiconductor device according to claim 4, wherein the oxide reduction film is formed as the material containing at least one kind of metallic element selected from K, Ca, Na, Mg, Al, Mn, Zn, Fe, Ni, Cd, Sn, Pb, Cu, Hg, and Ag.

6. The manufacturing method of the semiconductor device according to claim 4, wherein the oxide reduction film is an oxide of said metallic element and is formed from a material in a state of incomplete oxidation.

7. The manufacturing method of the semiconductor device according to claim 1, further comprising a step of,
   after forming the oxide reduction film on the lower electrode film, before removing the oxide reduction film, heat-treating the semiconductor substrate.

8. The manufacturing method of the semiconductor device according to claim 1, wherein the oxide reduction film is formed by a high frequency sputtering method.

9. The manufacturing method of the semiconductor device according to claim 1, wherein the oxide reduction film is removed using dilute hydrofluoric acid.

10. The manufacturing method of the semiconductor device according to claim 1, wherein the capacitor film is a PZT film.

11. The manufacturing method of the semiconductor device according to claim 1, wherein the capacitor film is formed by an MOCVD method.

12. The manufacturing method of the semiconductor device according to claim 1, wherein the capacitor structure is a stacked type structure in which electric connection is made under the lower electrode and on the upper electrode.

13. The manufacturing method of the semiconductor device according to claim 12, further comprising a step of, before forming the lower electrode film, forming a tungsten (W) plug to be electrically connected to the lower electrode.

14. The manufacturing method of the semiconductor device according to claim 13, further comprising a step of,
after forming the W plug, before forming the lower electrode film, sequentially forming an orientation property improving film improving an orientation property of the capacitor film and a oxygen barrier film preventing oxidation of the W plug.

15. A manufacturing method of a semiconductor device comprising:
forming a lower electrode over an insulating film;
forming an oxide reduction film over the lower electrode, the oxide reduction film reducing an oxide film formed over the lower electrode;
removing the oxide reduction film;
after removing the oxide reduction film, forming a ferroelectric film over the lower electrode; and
forming an upper electrode over the ferroelectric film.

16. The manufacturing method of the semiconductor device according to claim 15, wherein the lower electrode is formed of iridium (Ir) or ruthenium (Ru).

17. The manufacturing method of the semiconductor device according to claim 15, wherein the oxide reduction film is formed as a material containing a metallic element whose ionization tendency is larger than an ionization tendency of the metal being a material of the lower electrode.

18. The manufacturing method of the semiconductor device according to claim 15, wherein the oxide reduction film is formed as the material containing at least one kind of metallic element selected from K, Ca, Na, Mg, Al, Mn, Zn, Fe, Ni, Cd, Sn, Pb, Cu, Hg, and Ag.

19. The manufacturing method of the semiconductor device according to claim 15, further comprising a step of, after forming the oxide reduction film on the lower electrode, before removing the oxide reduction film, heat-treating the semiconductor substrate.

* * * * *